(12) United States Patent
Classen et al.

(10) Patent No.: US 9,266,720 B2
(45) Date of Patent: Feb. 23, 2016

(54) HYBRID INTEGRATED COMPONENT

(71) Applicants: Johannes Classen, Reutlingen (DE); Axel Franke, Wannweil (DE); Jens Frey, Filderstadt (DE); Heribert Weber, Nuertingen (DE); Frank Fischer, Gomaringen (DE); Patrick Wellner, Walddorfhaeslach (DE); Mirko Hattass, Stuttgart (DE); Daniel Christoph Meisel, Reutlingen (DE)

(72) Inventors: Johannes Classen, Reutlingen (DE); Axel Franke, Wannweil (DE); Jens Frey, Filderstadt (DE); Heribert Weber, Nuertingen (DE); Frank Fischer, Gomaringen (DE); Patrick Wellner, Walddorfhaeslach (DE); Mirko Hattass, Stuttgart (DE); Daniel Christoph Meisel, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/059,202

(22) Filed: Oct. 21, 2013

(65) Prior Publication Data
US 2014/0117475 A1    May 1, 2014

(30) Foreign Application Priority Data
Oct. 25, 2012    (DE) .......................... 10 2012 219 550

(51) Int. Cl.
*B81C 1/00*    (2006.01)

(52) U.S. Cl.
CPC ........... *B81C 1/00246* (2013.01); *B81C 1/0023* (2013.01); *B81C 2203/075* (2013.01); *B81C 2203/0771* (2013.01)

(58) Field of Classification Search
CPC .............................. H04R 23/006; H01L 29/00
USPC ...................... 257/253, 254, 417, 418; 438/51
See application file for complete search history.

(56) References Cited

U.S. PATENT DOCUMENTS

| | | | |
|---|---|---|---|
| 2009/0008728 A1* | 1/2009 | Fujii et al. ..................... 257/415 |
| 2010/0058865 A1* | 3/2010 | Zhang et al. ................ 73/514.38 |
| 2010/0193884 A1* | 8/2010 | Park et al. ..................... 257/414 |
| 2010/0270630 A1* | 10/2010 | Fujii et al. ..................... 257/415 |
| 2011/0048131 A1* | 3/2011 | Reinmuth ................... 73/504.12 |
| 2011/0049652 A1 | 3/2011 | Wu et al. |
| 2011/0061460 A1* | 3/2011 | Seeger et al. ............... 73/504.12 |
| 2012/0248615 A1* | 10/2012 | Chien et al. ................... 257/770 |

* cited by examiner

*Primary Examiner* — Karen Kusumakar
*Assistant Examiner* — Adam S Bowen
(74) *Attorney, Agent, or Firm* — Kenyon & Kenyon LLP

(57) ABSTRACT

A component has at least one MEMS element and at least one cap made of a semiconductor material. The cap, in addition to its mechanical function as a terminus of a cavity and protection of the micromechanical structure, is provided with an electrical functionality. The micromechanical structure of the MEMS element of the component is situated in a cavity between a carrier and the cap, and includes at least one structural element which is deflectable out of the component plane within the cavity. The cap includes at least one section extending over the entire thickness of the cap, which is electrically insulated from the adjoining semiconductor material in such a way that it may be electrically contacted independently from the remaining sections of the cap.

13 Claims, 2 Drawing Sheets

HYBRID INTEGRATED COMPONENT

BACKGROUND OF THE INVENTION

1. Field of the Invention

The present invention relates to a component having at least one MEMS (micro-electromechanical system) element and having at least one cap made of a semiconductor material, the micromechanical structure of the MEMS element being situated in a cavity between a carrier and the cap and including at least one structural element, which is deflectable out of the element plane within the cavity.

2. Description of the Related Art

Components having MEMS elements have been manufactured in mass production for some years for greatly varying applications, for example, in the field of automotive technology and consumer electronics. The MEMS element may be a sensor element having detection means for detecting the deflection of the micromechanical structural element or also an actuator element having drive means for activating the deflectable structural element. The cap protects the micromechanical structure of the MEMS element from environmental influences, such as particles, moisture, and aggressive environmental media. In addition, defined pressure conditions may be produced within the cavity if the cap is installed in a hermetically sealed way.

A concept for a vertical hybrid integrated component is presented in US Patent Application Publication No. 2011/0049652 A1, according to which a chip stack is formed from an ASIC, a MEMS, and a cap. In the method described here, the starting substrate for the MEMS element is bonded onto an already processed ASIC substrate. Only thereafter is a micromechanical structure produced in the MEMS substrate, which includes at least one deflectable structural element. Independently thereof, a cap is structured from a semiconductor material and prepared for the installation above the micromechanical structure of the MEMS substrate, on the ASIC substrate. The cap wafer thus processed is bonded after the structuring of the MEMS substrate onto the ASIC substrate, so that the micromechanical structure is enclosed hermetically sealed in a cavity between the ASIC substrate and the cap.

The component described in US Patent Application Publication No. 2011/0049652 A1 is equipped with a capacitor system, which—depending on the MEMS function—may be used for detecting externally caused deflections of the structural element or also for activating, i.e., for moving, the deflectable structural element. For this purpose, the capacitor system includes at least one deflectable electrode on the deflectable structural element of the MEMS element and stationary electrodes, which are implemented here in a structured metal layer on the surface of the ASIC substrate.

BRIEF SUMMARY OF THE INVENTION

Measures are provided by the present invention, by which the cap of a component of the type mentioned at the outset may be equipped with an electrical functionality, in addition to its mechanical function as a terminus of the cavity and protection of the micromechanical structure.

This is achieved according to the present invention in that the cap includes at least one section extending over the entire thickness of the cap, which is electrically insulated from the adjoining semiconductor materials in such a way that it may be electrically contacted independently from the remaining sections of the cap.

Therefore, according to the present invention, individual sections extending over the entire thickness of the cap are electrically decoupled. This opens up the possibility of integrating multiple electrical functions, which are independent of one another, into the cap, and integrating each of them in an electrically insulated section of the cap. In the simplest case, the electrically insulated sections of the cap are merely set to a defined electrical potential. However, it is also possible to provide individual sections of the cap with more complex circuit functions.

Fundamentally, there are various possibilities for the implementation and the utilization of a cap having electrically insulated sections according to the present invention, and for the implementation of a component having such a cap.

The electrical insulation between individual sections of the cap is advantageously produced using standard methods of semiconductor processing. In one preferred variant, the cap is initially structured for the purpose of defining the individual sections to be insulated by way of peripheral trench structures. These trench structures are then entirely or at least partially filled using an electrically insulating material. By way of rear-side thinning of the cap, the electrically insulating structures thus produced may extend over the entire thickness of the cap wafer and electrically separate the individual sections.

Depending on the function of the MEMS element of a component according to the present invention, it may be advantageous if the surface of the cap facing toward the cavity is structured, specifically in such a way that the micromechanical structure of the MEMS element, in the non-deflected state, is located at a defined distance to at least one electrically insulated section of the cap. With the aid of such structuring, for example, stop structures, which are at a defined electrical potential, may be produced in the cap as a mechanical overload protection for the deflectable structural element. In this way, short-circuits in the component may be avoided or mechanical contact may be electrically detected.

In one particularly advantageous specific embodiment of the present invention, the electrically insulated sections of the cap are used as stationary electrodes of a capacitor system for signal detection or activation of the micromechanical structure. The deflectable structural element of the MEMS element functions here as a carrier of at least one deflectable electrode of the capacitor system. In this case, the distance between the electrode planes of the capacitor system may be intentionally influenced by suitable structuring of the surface of the cap facing toward the cavity. The cap may thus be reduced in its thickness, for example, to increase the electrode distance in the area over the deflectable structural element.

As already mentioned, the electrically insulated sections of the cap may be electrically contacted according to the present invention. The electrical connection to the electrically insulated sections of the cap is advantageously established during its installation above the micromechanical structure of the MEMS element, so that the electrical contacting takes place via the MEMS element and/or the carrier. This simplifies the external electrical contacting of the entire component.

In a first component variant, the functionality of the MEMS element is implemented in a layered structure on a semiconductor substrate, which functions as a carrier. This layered structure of the MEMS element includes at least one printed conductor layer and at least one functional layer, in which the micromechanical structure of the MEMS element having the at least one deflectable structural element is implemented. The printed conductor layer is insulated, on the one hand, by at least one insulation layer from the semiconductor substrate and is insulated, on the other hand, by at least one insulation layer from the functional layer. In this case, the electrically insulated sections of the cap are advantageously electrically contacted via the printed conductor layer of the MEMS element, and also the MEMS function in the functional layer. The electrical connection between the cap and the printed conductor layer may be established, for example, via a bond connection between the cap and the functional layer and a contact opening between the functional layer and the printed conductor layer.

However, the component concept according to the present invention may also advantageously be implemented in the form of a threefold wafer stack having an ASIC component as a carrier, having a MEMS element, whose micromechanical structure extends over its entire thickness, and having a cap configured according to the present invention. The MEMS element is installed here on the ASIC element in such a way that a gap exists between the deflectable structural element and the surface of the ASIC element. In this component variant, the electrically insulated sections of the cap are advantageously electrically contacted via the ASIC element. The electrical connection between the cap and the ASIC element may also be established simply here via bond connections and possibly via through contacts in the MEMS element.

As already indicated, components, whose micromechanical function is based on a capacitive detection principle or excitation principle, represent a preferred application for the component concept according to the present invention. It has proven to be particularly advantageous in this context that the electrical functionality of the cap allows the implementation of differential capacitor systems having three electrode layers. For this purpose, the deflectable structural element is equipped with at least one electrode, which forms the middle electrode of such a differential capacitor system. The stationary "out of plane" electrodes are implemented, on the one hand, on the carrier and, on the other hand, on the cap. Using this type of capacitor system, a comparatively high sensitivity of the MEMS function may be achieved, since the area of the detection means is enlarged on a predefined available space. In addition, an improved offset stability may be achieved by more spatially separated detection means in the case of micromechanical acceleration sensors. In the case of micromechanical yaw rate sensors, in particular out-of-plane detecting sensors, the influence of interfering effects, such as bending and vibration, may be reduced by situating electrodes above and below the movable structure.

DETAILED DESCRIPTION OF THE INVENTION

Figure 1:
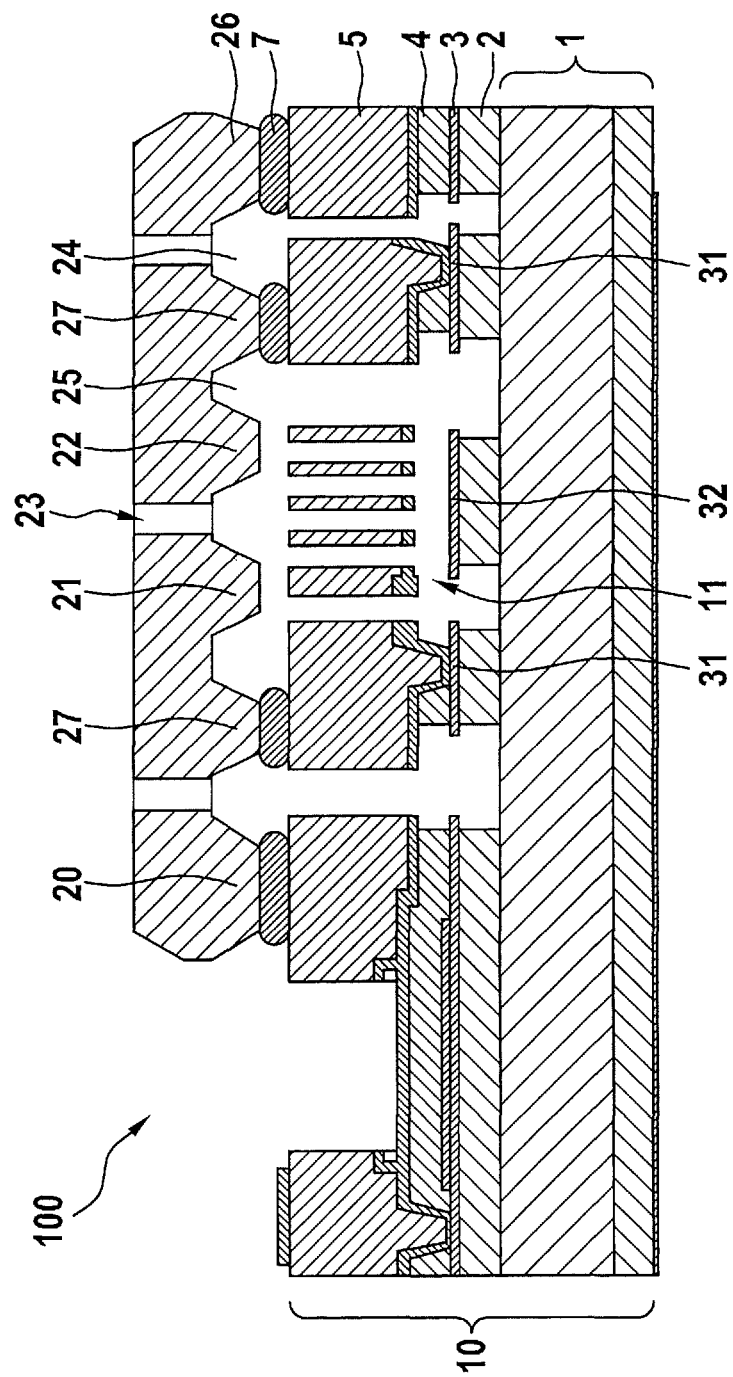
FIG. 1 shows a schematic sectional view of a sensor component 100 according to the present invention in the form of a twofold wafer stack.

Sensor component 100 shown in FIG. 1 essentially includes a MEMS element 10 and a cap 20.

The functionality of MEMS element 10 is implemented in a layered structure on a semiconductor substrate 1. This may be a silicon substrate, for example. The layered structure includes a printed conductor layer 3 and a functional layer 5. Printed conductor layer 3 is implemented here in the form of a doped polysilicon layer, which was deposited above a first insulation layer 2 made of, for example, silicon oxide or silicon nitride on semiconductor substrate 1. The printed conductor layer may also be implemented, however, in the form of a metal layer, made of, for example, aluminum, copper, gold, or platinum. By structuring polysilicon layer 3, individual areas of printed conductor layer 3 were spatially separated from one another, in order to produce printed conductors, a terminal area 31 for the micromechanical sensor structure, and also a stationary electrode 32. A further insulation layer 4 was initially produced and structured above printed conductor layer 3 thus structured, before a thick functional layer 5, made of polysilicon, for example, was deposited on the layered structure. Insulation layer 4 is used here as electrical insulation between printed conductor layer 3 and functional layer 5, but also as a sacrificial layer, which was regionally removed after the structuring of functional layer 5, to expose the micromechanical sensor structure thus produced in functional layer 5. Accordingly, the thickness of sacrificial layer 4 determines the distance between the micromechanical structure and electrode 32 in printed conductor layer 3. Typical distances between the micromechanical sensor structure and printed conductor layer 3 are 0.5 µm to 3 µm, preferably 1.0 µm to 2.0 µm. In the exemplary embodiment described here, the micromechanical sensor structure includes a seismic mass 11, which is attached both mechanically and also electrically to terminal area 31 of printed conductor layer 3. Seismic mass 11 functions as a movable electrode of the measuring capacitor system.

Cap 20 was structured and preprocessed independently of MEMS element 10. According to the present invention, electrically insulated sections 21, 22 were produced, which are delimited by an electrical insulation 23 extending over the entire thickness of cap 20.

For this purpose, depressions 24 and 25 were produced in the surface of cap 20 in a first etching step. The etching method determines the shape of the resulting trench structure. Since in the present exemplary embodiment, isotropic potassium hydroxide etching was used in the first etching step, depressions 24 and 25 are V-shaped here. While depressions 24 define electrically insulated sections 21 and 22 and a frame area 26, contact areas 27 for electrically insulated sections 21, 22 are defined by depressions 25. In a second anisotropic etching step, depressions 24 were trenched further up to a specific depth. These insulation trenches 23 were then filled with an electrically insulating material, for example, an oxide. Cap 20 was then ground back on the rear side enough that filled insulation trenches 23 extend now over the entire remaining thickness of cap 20.

Cap 20 thus processed was then installed face down, i.e., using the structured surface, on the layered structure of MEMS element 10. Both the mechanical connection and the electrical connection between cap 20 and MEMS element 10 were established here in a bonding method using electrically conductive connection materials 7. For example, electrically conductive metals are suitable for this purpose, such as aluminum, gold, copper, or doped metalloids, such as silicon or germanium, or also metal alloys, preferably in eutectic composition, for example, silicon/gold or aluminum/germanium. The melting temperature is reduced in comparison to the pure alloy components by the eutectic composition, which provides advantages during the establishment of a bond connection. It is ensured by peripheral bond connection 7 in frame area 26 that the sensor structure having seismic mass 11 is enclosed hermetically sealed between MEMS substrate 1 and cap 20. Bond connections 7 in contact areas 27 are primarily used for the electrical contacting of electrically insulated sections 21 and 22, which are utilized as further stationary electrodes of the measuring capacitor system. These electrodes 21 and 22 are connected via bond connection 7 and MEMS element 10 to printed conductor layer 3.

Accordingly, the measuring capacitor system of sensor component 100 thus includes three electrode layers, specifically printed conductor layer 3 having stationary electrode 32, functional layer 5 having seismic mass 11 as a deflectable electrode, and cap wafer 20 having electrically insulated sections 21 and 22, which function as further stationary electrodes of the capacitor system. The deflections of seismic mass 11 may be detected as a capacitance change using this measuring capacitor system.

In the case of such a capacitor system, it is particularly reasonable and effective if the two layers having stationary electrodes 32 and 21, 22 are situated symmetrically to seismic mass 11, i.e., if the distance between sections 21, 22 of cap 20 and the upper side of seismic mass 11 and the distance between printed conductor layer 3 and the lower side of seismic mass 11 are of approximately equal size. Therefore, the thickness of bond connection 7 is advantageously adapted to the thickness of insulation or sacrificial layer 4. This offers performance advantages in particular in the case of inertial sensors. Inter alia, this contributes to the vibration robustness and to improved offset stability, since in particular in the case of sensors which move out of the plane, a fully differential analysis of the capacitance change may take place. In the case of movement, one capacitance is increased, and the other is reduced, so that in total more signal is implemented on existing available surface.

Figure 2:
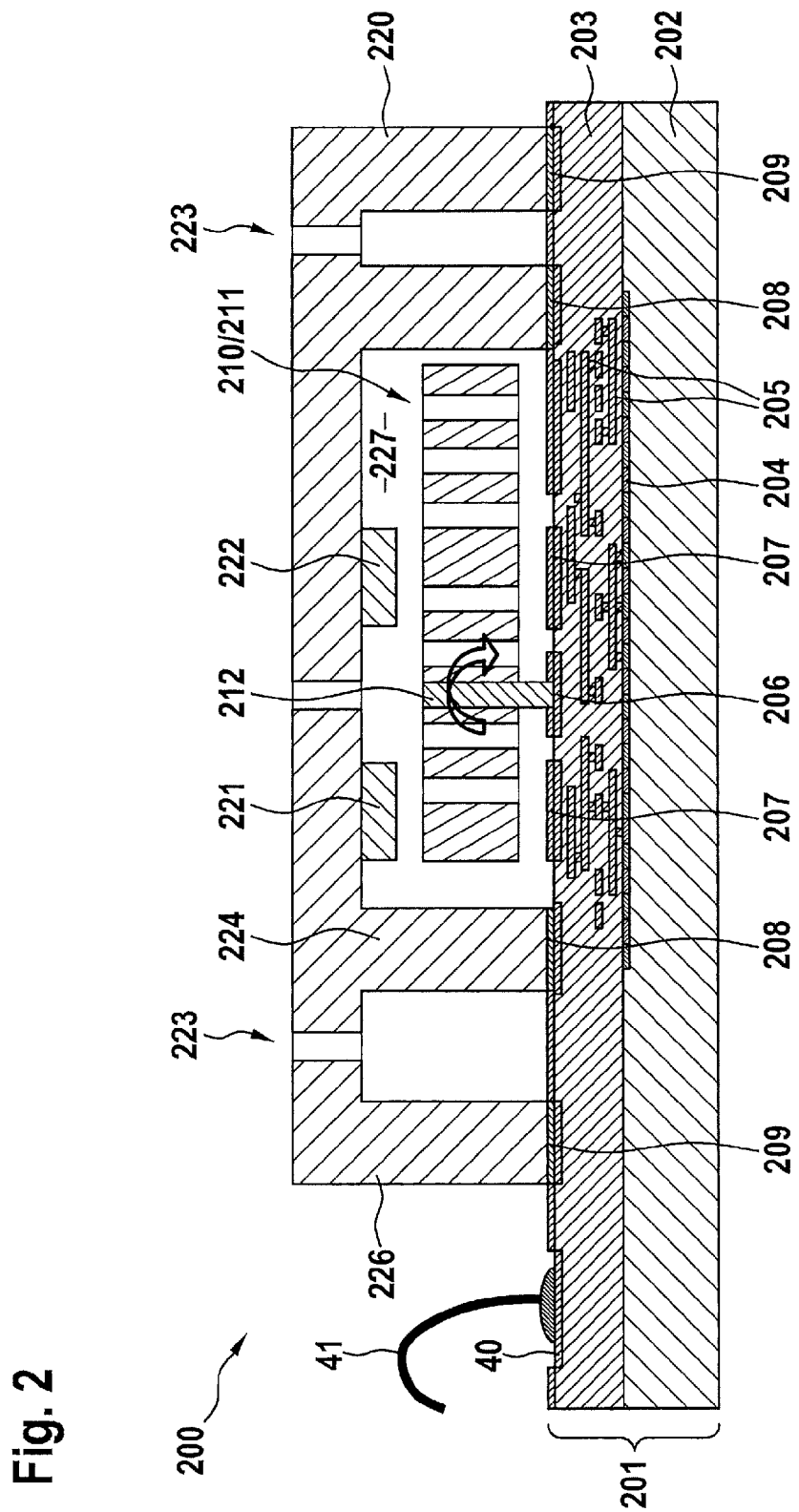
FIG. 2 shows a schematic sectional view of an inertial sensor component 200 according to the present invention in the form of a threefold wafer stack.

In contrast to above-described sensor component 100, sensor component 200 shown in FIG. 2 is a threefold wafer stack having an ASIC element 201 as a carrier, a MEMS element 210, whose micromechanical structure extends over the entire thickness of the element, and a cap 220.

ASIC element 201 includes a starting substrate 202, into which circuit functions 204 are integrated. These are interconnected via circuit layers 205 of backend stack 203 on starting substrate 202. These circuit layers 205 are implemented in the form of structured metal layers, which are spatially and electrically separated from one another and from starting substrate 202 by insulation layers. At least parts of a signal processing and analysis circuit for assigned MEMS element 210 are advantageously integrated into ASIC element 201. In addition, however, MEMS-independent circuit functions may also be implemented. A terminal area 206 for seismic mass 211 of MEMS element 210 is implemented in the uppermost circuit layer of ASIC element 201 here, and also two electrodes 207 of a measuring capacitor system, terminal areas 208 for electrically insulated sections 221, 222 of cap 220, a peripheral installation area 209 for cap 220, and a bond pad area 40 for the external contacting of sensor component 200.

MEMS element 210 is installed on backend stack 203 of ASIC element 201 in such a way that a distance exists between seismic mass 211 and backend stack 203. For this purpose, MEMS element 210 is both mechanically and electrically connected to ASIC element 201 via a through contact 212 in terminal area 206 in the exemplary embodiment shown here. In the present case, MEMS element 210 is a z acceleration sensor in a rocker design. The micromechanical sensor structure extends over the entire thickness of MEMS element 210 and is spring-mounted like a rocker, as illustrated by the arrow in FIG. 2, via through contact 212, which is situated off-center. Rocker structure 211 also functions as a deflectable electrode of the measuring capacitor system in the case of sensor element 200.

Cap 220 is installed also here over MEMS element 210 on backend stack 203 of ASIC element 201. Like cap 20 of sensor component 100, cap 220 is also structured. It is to be noted here that cap 220 may also be implemented in the form of a layered structure and/or as a composite of multiple semiconductor substrates. According to the present invention, cap 220 includes electrically insulated sections 221 and 222, which extend over the entire thickness of cap 220, and also electrical insulation 223 between sections 221 and 222. The two electrically insulated sections 221 and 222 are each situated opposite to electrodes 207 on backend stack 203 of ASIC element 201 and are also used as stationary electrodes of the measuring capacitor system. The electrical contacting of these sections 221 and 222 takes place via support-type extensions 224 in the surface of cap 220 facing toward ASIC element 201 and their electrically conductive bond connection in terminal areas 208 in the uppermost circuit layer of ASIC backend stack 203. Sections 221 and 222 of cap 220 are not only electrically insulated from one another, but rather also from a peripheral edge area 226, via which cap 220 is connected hermetically sealed to installation area 209. In the case of component 200 shown here, entire MEMS element 210 is thus situated in cavity 227 between ASIC element 201 and cap 220.

In the case of acceleration in the z direction, rocker structure 221 is deflected or tilted. On both sides of through contact 212, the mount of rocker structure 211, either the upper or the lower electrode gap is enlarged between rocker structure 211 and one opposing stationary electrode, while the other electrode gap between rocker structure 211 and the other opposing stationary electrode shrinks, which results in each case in corresponding capacitance changes. Rocker structure 211 thus forms, together with stationary electrodes 207 in the uppermost circuit layer of ASIC backend stack 203 and stationary electrodes 221 and 222 of cap 220, a fully differential measuring capacitor system for detecting the deflections of rocker structure 211.

Sensor component 200 is placed and mechanically fixed on the ASIC side on a carrier, for example, a circuit board, within the scope of the assembly and connection technology. The electrical contacting of sensor component 200 takes place here via exposed bond pad area 40 in the uppermost circuit layer of ASIC backend stack 203, i.e., on the upper side of ASIC element 201 and via wire bonds 41.

What is claimed is:

1. A component, comprising:
   at least one MEMS element; and
   at least one cap made of a semiconductor material, wherein the micromechanical structure of the at least one MEMS element is situated in a cavity between a carrier and the at least one cap, and wherein the micromechanical structure includes at least one deflectable structural element which is deflectable out of a component plane within the cavity, and wherein the at least one cap includes at least one section which (i) extends over the entire thickness of the cap, and (ii) is electrically insulated from the adjoining semiconductor material in such a way that the at least one section is electrically contacted independently of remaining sections of the at least one cap; and
   a capacitor system for at least one of signal detection and excitation of the at least one deflectable structural element;
   wherein the deflectable structural element is provided with at least one electrode of the capacitor system, wherein at least one stationary counter electrode of the capacitor system is implemented on the carrier, wherein a first stationary counter electrode of the capacitor system is implemented in the cap in at least one electrically insulated section, and wherein at least one further stationary counter electrode is implemented in the cap in a second electrically insulated section, and wherein there are no electrodes on an outer surface of the cap, wherein the outer surface of the cap is opposite an inner surface of the cap, the inner surface of the cap having trench structures in the semiconductor material.

2. The component as recited in claim 1, wherein the electrical insulation between individual sections of the cap and the adjoining semiconductor material is implemented in the form of the trench structures in the semiconductor material, and wherein the trench structures extend over the entire thickness of the cap and are at least partially filled with an electrically insulating material.

3. The component as recited in claim 1, wherein the surface of the cap facing toward the cavity is structured such that the micromechanical structure of the MEMS element is located in the non-deflected state at a defined distance to the at least one electrically insulated section of the cap.

4. The component as recited in claim 1, wherein the at least one electrically insulated section of the cap functions as a mechanical stop for the at least one deflectable structural element.

5. The component as recited in claim 1, wherein the at least one electrically insulated section of the cap functions as an electrode for at least one of (i) a capacitive detection of a deflection of the at least one deflectable structural element and (ii) a capacitive excitation of the at least one deflectable structural element.

6. The component as recited in claim 1, wherein an electrical connection exists between the at least one electrically insulated section of the cap and at least one of the MEMS element and the carrier.

7. The component as recited in claim 1, wherein:
the functionality of the MEMS element is implemented in a layered structure on the carrier;
the layered structure of the MEMS element includes at least one printed conductor layer and at least one functional layer in which the micromechanical structure of the MEMS element having the at least one deflectable structural element is implemented;
the printed conductor layer is insulated from the semiconductor substrate by at least one insulation layer, and the printed conductor layer is insulated from the functional layer by at least one other insulation layer; and
the at least one electrically insulated section of the cap is electrically contacted via the printed conductor layer of the MEMS element.

8. The component as recited in claim 1, wherein:
the micromechanical structure having the at least one deflectable structure element extends over the entire thickness of the MEMS element;
an ASIC element is provided as the carrier on which the MEMS element is installed, such that a gap exists between the deflectable structural element and the surface of the ASIC element; and
the at least one electrically insulated section of the cap is electrically contacted via the ASIC element.

9. The component as recited in claim 1, wherein the electrical insulation between individual sections of the cap and the adjoining semiconductor material is implemented in the form of the trench structures in the semiconductor material, and wherein the trench structures extend over the entire thickness of the cap and are at least partially filled with an electrically insulating material, and wherein the surface of the cap facing toward the cavity is structured such that the micromechanical structure of the MEMS element is located in the non-deflected state at a defined distance to the at least one electrically insulated section of the cap.

10. The component as recited in claim 9, wherein an electrical connection exists between the at least one electrically insulated section of the cap and at least one of the MEMS element and the carrier.

11. The component as recited in claim 1, wherein the at least one electrically insulated section of the cap functions as a mechanical stop for the at least one deflectable structural element, and wherein the at least one electrically insulated section of the cap functions as an electrode for at least one of (i) a capacitive detection of a deflection of the at least one deflectable structural element and (ii) a capacitive excitation of the at least one deflectable structural element.

12. The component as recited in claim 11, wherein an electrical connection exists between the at least one electrically insulated section of the cap and at least one of the MEMS element and the carrier.

13. The component as recited in claim 1, wherein:
the functionality of the MEMS element is implemented in a layered structure on the carrier;
the layered structure of the MEMS element includes at least one printed conductor layer and at least one functional layer in which the micromechanical structure of the MEMS element having the at least one deflectable structural element is implemented;
the printed conductor layer is insulated from the semiconductor substrate by at least one insulation layer, and the printed conductor layer is insulated from the functional layer by at least one other insulation layer;
the at least one electrically insulated section of the cap is electrically contacted via the printed conductor layer of the MEMS element;
the micromechanical structure having the at least one deflectable structure element extends over the entire thickness of the MEMS element;
an ASIC element is provided as the carrier on which the MEMS element is installed, such that a gap exists between the deflectable structural element and the surface of the ASIC element; and
the at least one electrically insulated section of the cap is electrically contacted via the ASIC element.

* * * * *